(12) United States Patent
Batenkow et al.

(10) Patent No.: US 9,663,064 B2
(45) Date of Patent: May 30, 2017

(54) SEAT BELT LOCK WITH HALL SENSOR

(71) Applicant: POLYCONTACT AG, Chur (CH)

(72) Inventors: Viktor Batenkow, Chur (CH); Silvano Bürgler, Surcuolm (CH); Carsten Käbisch, Domat/Ems (CH); Josua Lanter, Chur (CH)

(73) Assignee: POLYCONTACT AG, Chur (CH)

( * ) Notice: Subject to any disclaimer, the term of this patent is extended or adjusted under 35 U.S.C. 154(b) by 247 days.

(21) Appl. No.: 14/493,870

(22) Filed: Sep. 23, 2014

(65) Prior Publication Data

US 2015/0082587 A1 Mar. 26, 2015

(30) Foreign Application Priority Data

Sep. 25, 2013 (CH) ...................................... 1641/13

(51) Int. Cl.
| | | |
|---|---|---|
| *G01B 7/14* | (2006.01) | |
| *B60R 22/48* | (2006.01) | |
| *H03K 17/97* | (2006.01) | |
| *H03K 17/95* | (2006.01) | |

(52) U.S. Cl.
CPC ................ *B60R 22/48* (2013.01); *G01B 7/14* (2013.01); *H03K 17/97* (2013.01); *B60R 2022/4808* (2013.01); *B60R 2022/4816* (2013.01); *H03K 17/9517* (2013.01); *Y10T 24/45241* (2015.01)

(58) Field of Classification Search
CPC ........... B60R 22/48; G01B 7/14; H03K 17/97
USPC ....................................................... 24/593.1
See application file for complete search history.

(56) References Cited

U.S. PATENT DOCUMENTS

| | | | | |
|---|---|---|---|---|
| 5,218,744 A | * | 6/1993 | Saito ..................... | B60R 22/023 24/303 |
| 5,742,986 A | * | 4/1998 | Corrion ................... | B60R 22/48 180/268 |
| 5,752,299 A | * | 5/1998 | Vivacqua ................ | B60R 22/48 24/303 |
| 5,839,174 A | * | 11/1998 | Chamings ............... | B60R 22/48 24/633 |
| 5,898,366 A | * | 4/1999 | Brown .................... | B60R 22/48 180/270 |
| 5,915,286 A | * | 6/1999 | Figi ......................... | B60R 22/48 73/865.9 |

(Continued)

FOREIGN PATENT DOCUMENTS

EP 0 861 763 A2 9/1998

*Primary Examiner* — Jason W San
(74) *Attorney, Agent, or Firm* — Buchanan Ingersoll & Rooney PC

(57) ABSTRACT

A seat belt lock with a Hall sensor for detection of a locking state of a seat belt lock having a metal seat belt lock frame arranged in a housing. The seat belt lock frame has an upper part and a lower part, connected to a define slit-like channel. A spring-loaded locking device for an inserted seat belt latch is mounted on the seat belt lock frame. A spring-loaded ejector for the inserted seat belt latch is arranged in the channel. The Hall sensor interacts with a permanent-magnetic component, whose distance relative to the Hall sensor is changeable based on translatory movement of the ejector in the case of actuation of the locking mechanism. The Hall sensor is arranged on or in the seat belt lock frame and is covered by a metal shielding element, which extends essentially parallel to the seat belt lock frame and forms a flow concentrator.

15 Claims, 3 Drawing Sheets

(56) References Cited

U.S. PATENT DOCUMENTS

| | | | | |
|---|---|---|---|---|
| 5,966,784 A * | 10/1999 | Arbogast | ............... | B60R 22/48 24/633 |
| 5,970,587 A * | 10/1999 | Knox | ............... | A44B 11/2565 24/603 |
| 6,076,239 A * | 6/2000 | Kopetzky | ............... | B60R 22/48 24/602 |
| 6,079,744 A * | 6/2000 | Husby | ............... | B60R 22/48 180/268 |
| 6,082,481 A * | 7/2000 | Engler | ............... | B60R 22/48 180/268 |
| 6,175,304 B1 * | 1/2001 | Becker | ............... | B60R 22/48 180/268 |
| 6,205,629 B1 * | 3/2001 | Becker | ............... | A44B 11/2523 24/303 |
| 6,230,088 B1 * | 5/2001 | Husby | ............... | B60R 22/1952 24/303 |
| 6,357,091 B1 * | 3/2002 | Devereaux | ............... | B60R 22/48 24/303 |
| 6,381,815 B1 * | 5/2002 | Yamaguchi | ............... | B60R 22/48 24/633 |
| 6,400,145 B1 * | 6/2002 | Chamings | ............... | B60R 22/16 24/633 |
| 6,474,435 B1 * | 11/2002 | Devereaux | ............... | B60R 22/48 180/270 |
| 6,725,509 B1 * | 4/2004 | Lee | ............... | A44B 11/2523 24/641 |
| 6,851,503 B2 * | 2/2005 | Almaraz | ............... | B60R 22/48 180/268 |
| 7,007,976 B2 * | 3/2006 | Ante | ............... | B60R 22/48 180/268 |
| 7,014,005 B2 * | 3/2006 | Martinez | ............... | B60R 22/48 180/268 |
| 7,116,220 B2 * | 10/2006 | Almaraz | ............... | B60R 22/48 24/68 SB |
| 7,765,652 B2 * | 8/2010 | Nakamuru | ............... | A44B 11/2569 24/633 |
| 2001/0025403 A1 * | 10/2001 | Kanbe | ............... | B60R 22/48 24/633 |
| 2002/0166216 A1 * | 11/2002 | Jain | ............... | A44B 11/2515 24/633 |
| 2003/0101553 A1 * | 6/2003 | Itoigawa | ............... | B60R 22/48 24/633 |
| 2004/0107550 A1 * | 6/2004 | Lee | ............... | B60R 22/48 24/633 |
| 2004/0111845 A1 * | 6/2004 | Lee | ............... | B60R 22/48 24/633 |
| 2004/0111846 A1 * | 6/2004 | Itoigawa | ............... | B60R 22/48 24/633 |
| 2004/0140890 A1 * | 7/2004 | Hartmann | ............... | B60R 22/48 340/457.1 |
| 2006/0290130 A1 * | 12/2006 | Hall | ............... | B60R 21/01546 280/801.1 |
| 2007/0271746 A1 * | 11/2007 | Midorikawa | ............... | B60R 22/48 24/633 |
| 2008/0163468 A1 * | 7/2008 | Nakamura | ............... | A44B 11/2569 24/641 |
| 2010/0102906 A1 * | 4/2010 | Lanter | ............... | B60R 22/48 335/205 |
| 2011/0080279 A1 * | 4/2011 | Lanter | ............... | B60R 22/48 340/457.1 |
| 2011/0084827 A1 * | 4/2011 | Lanter | ............... | B60R 22/48 340/457.1 |
| 2011/0094067 A1 * | 4/2011 | Lombriser | ............... | B60R 22/48 24/166 |
| 2011/0277281 A1 * | 11/2011 | Metzger | ............... | B60R 22/18 24/662 |
| 2012/0080917 A1 * | 4/2012 | Miller | ............... | B60N 2/2812 297/250.1 |
| 2012/0310483 A1 * | 12/2012 | Lanter | ............... | B60R 22/48 701/45 |
| 2012/0318646 A1 * | 12/2012 | Lanter | ............... | B60R 22/48 200/61.58 B |
| 2013/0207442 A1 * | 8/2013 | Sickon | ............... | G01B 7/003 297/468 |
| 2014/0123446 A1 * | 5/2014 | Lanter | ............... | B60R 22/48 24/593.1 |

\* cited by examiner

SEAT BELT LOCK WITH HALL SENSOR

RELATED APPLICATION(S)

This application claims priority under 35 U.S.C. §119 to Swiss Patent Application No. 1641/13 filed in Switzerland on Sep. 25, 2013, the entire content of which is hereby incorporated by reference in its entirety.

FIELD

The disclosure relates to a seat belt lock with a Hall sensor as a detector for detection of the locking state of the seat belt lock.

BACKGROUND INFORMATION

In the case of restraint systems, for example in automobiles, it should be ensured for the proper operation of safety devices, such as front, knee, side and/or head airbags, that a passenger restraint system provided in a vehicle is also used and is properly locked. Otherwise, the safety devices, for example, airbag devices, could lead to injuries of the affected passenger in the case of a collision. It has been proposed to check the locking state of a latch of a seat belt that is inserted into a seat belt lock. From knowing the locking state of the seat belt lock, for example, signals can be generated in order to alert the passengers by a signal that they should put on and latch the seat belts. Ever since the introduction of airbag devices, the information on the locking state of the seat belt system has also become important for the activation or deactivation of mechanisms for inflating driver and passenger airbags or knee, side and head airbags.

Hall sensors are used as proximity switches or as sensors for non-contact determination of the state of components, which can occupy two positions. Hall sensors can include a semiconductor layer that is provided with a constant current, such as in an integrated design. The constant current is influenced by a magnetic field component perpendicular to the semiconductor layer, and the sensor yields a Hall voltage that can be evaluated, that can be tapped off and used to analyze a state, or can be employed directly as turn-on voltage. The integrated design of Hall sensors allows integrating on the Hall sensor an analysis circuit that is already suitable for analyzing the switch state.

EP-A-0 861 763 discloses a seat belt lock with an integrated prestressed Hall sensor, which detects, in a non-contact manner, the state of a locking body or an ejector for a lock latch introduced into the seat belt lock. In this case, a Hall sensor is arranged with a Hall field in the immediate vicinity of a permanent magnet. By a change in position of the locking body or the ejector, both of which elements include a ferromagnetic material, the magnetic field of the permanent magnet can be changed. As a result, the signal of the Hall sensor is also changed, and at the output of the Hall sensor, the change in state can be tapped off as a change in voltage. In an alternative variant embodiment, it is proposed to install the Hall sensor with a Hall field without a permanent magnet and for this purpose to design the locking body or the ejector as a permanent magnet. Also, in this arrangement, the change in position of the locking body or the ejector is to be detectable by a change in the Hall voltage.

In the seat belt lock according to EP-A-0 861 763, the Hall sensor is relatively sensitive compared to outside scatter fields, which can even be caused by, for example, a magnetic key attachment. The susceptibility relative to outside scatter fields can also be magnified in that the signal changes, because of the comparatively short distances that are covered by the locking body or the ejector when opening or closing the seat belt locking, are relatively small. Also, the seat belt lock variants without prestressed Hall sensors, in which either the locking body or the ejector are designed as permanent magnets, have proven to be not very practicable. The signal changes that can be achieved are also relatively small here. By the vibrations of the locking body and the ejector when the seat belt lock is opened and closed, demagnetization can result over time in the case of known magnets. This ultimately can lead to the Hall sensor no longer detecting the changes in state of the seat belt lock.

To reduce fuel consumption, major efforts are being undertaken to reduce the weight of inserts and attachments of motor vehicles. To this end, inserts, such as, for example, seat belt locks of restraint systems, are also made smaller. Because of the smaller space that is available, the devices for detection of the locking state of the seat belt locks should also be modified. With respect to the desired robustness of the devices, and to ensure, for example, up to 100,000 cycles of operation, such modifications may not be trivial.

SUMMARY

A seat belt lock is disclosed comprising: a Hall sensor for detection of a locking state of the seat belt lock; a metal seat belt lock frame arranged in a seat belt lock housing, the frame having an essentially flat upper part and a corresponding essentially flat lower part, the upper part and the lower part being connected to one another in such a way that they bound a slit-like guide channel to receive an inserted seat belt latch; a spring-loaded locking device for locking a seat belt latch when inserted, the spring-loaded locking device being mounted on the seat belt lock frame; and a spring-loaded ejector for an inserted seat belt latch, the spring-loaded ejector being moveable in the guide channel in a translatory manner between a first end position and a second end position, the seat belt latch being coupled to a locking mechanism, as well as to the Hall sensor for detection of a locking state of the seat belt lock, wherein the Hall sensor will interact with a permanent-magnetic component, whose distance relative to the Hall sensor will change based on the translatory movement of the ejector during actuation of the locking mechanism, the Hall sensor being arranged on or in the seat belt lock frame and being covered by a metal shielding element extending essentially parallel to the seat belt lock frame and forming a flow concentrator for a magnetic field produced by the permanent-magnetic component and acting on the Hall sensor.

BRIEF DESCRIPTION OF THE DRAWINGS

Other advantages and features of the disclosure will emerge from the following description of exemplary embodiments of a seat belt lock that, in diagrammatic depiction, is not true to scale.

DETAILED DESCRIPTION

Figure 1:
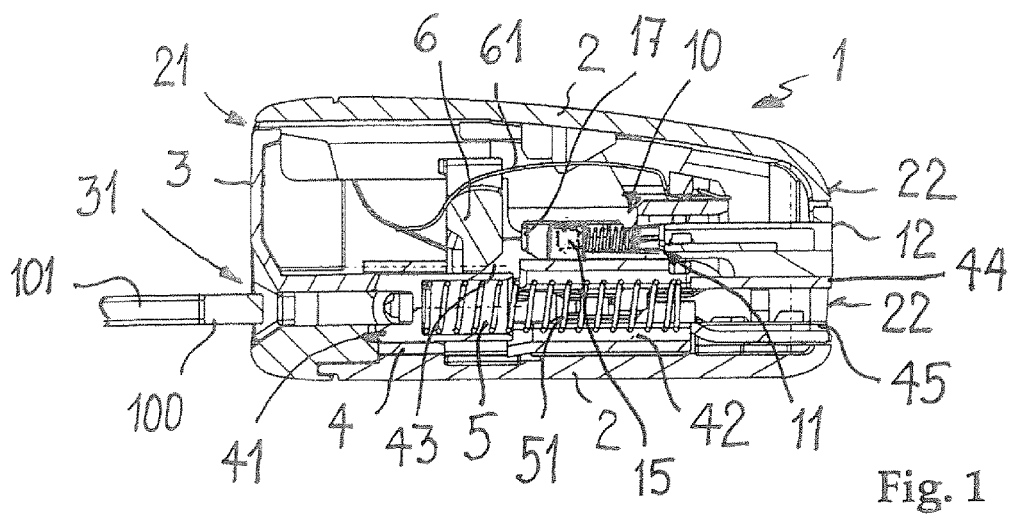
FIG. 1 shows a sectional view of a seat belt lock according to an exemplary embodiment of the disclosure that is in the unlocked state with an indicated seat belt latch.

Exemplary embodiments of this disclosure relate to a seat belt lock with a Hall sensor as a detector device for detection of the locking state of the seat belt lock, which can counteract drawbacks of known seat belt locks. The seat belt lock can have a simple and compact design and does not require any change in the design principle of the known seat belt locks. In addition, the Hall sensor within the seat belt lock can be largely insensitive to external scatter fields and experiences a sufficiently large signal change even in the case of short paths of the components in question, based on design, in order to ensure a reliable check of the locking state.

A seat belt lock with a Hall sensor for detection of the locking state of the seat belt lock, which can have a metal seat belt lock frame arranged in a seat belt lock housing, is provided by exemplary embodiments of the disclosure. The seat belt lock frame can have an upper part and a corresponding lower part, both of which parts are designed essentially flat and are connected to one another in such a way that they bound a slit-like guide channel for an inserted seat belt latch. A spring-loaded locking device for the inserted seat belt latch is mounted on the seat belt lock frame. In the guide channel, a spring-loaded ejector for the inserted seat belt latch is arranged, which seat belt latch can be moved in a translatory manner from a first end position into a second end position and back and is coupled to the locking mechanism. A Hall sensor arranged inside the seat belt lock is used for detection of the locking state of the seat belt lock. The Hall sensor interacts with a permanent-magnetic component, whose distance relative to the Hall sensor can be changed based on the translatory movement of the ejector in the case of actuation of the locking mechanism. The Hall sensor can be arranged on or in the metal seat belt lock frame and can be covered by a metal shielding element, which extends essentially parallel to the seat belt lock frame and forms a flow concentrator for the magnetic field produced by the permanent-magnetic component and acting on the Hall sensor.

The seat belt lock according to an exemplary embodiment of the disclosure can have a very compact design. For shielding against outer noise fields, the Hall sensor can be arranged between the metal frame and a metal shielding element. The metal shielding element at the same time forms a flow concentrator for the magnetic field produced by a permanent-magnetic component. The signal change on the Hall sensor can be produced by a change in the relative distance between the Hall sensor and the permanent-magnetic component because of the actuation of the locking mechanism. In this case, the flow concentrator provides for a sufficiently large change in the magnetic field that acts on the Hall sensor, so that a correspondingly large signal change can be produced.

An exemplary embodiment of the seat belt lock according to the disclosure calls for the Hall sensor and the shielding element to be arranged in a stationary manner on the frame. The stationary arrangement of the Hall sensor and shielding element acting as a flow concentrator can make it easier to bring the Hall sensor into electrical contact. For example, the contact lines are not exposed to any mechanical stresses because of the movement of the Hall sensor. The change in the relative distance between the Hall sensor and the permanent-magnetic component is carried out by translatory movement of the permanent-magnetic component.

Another exemplary embodiment of the disclosure calls for the permanent-magnetic component to be moved in a translatory manner from a first end position into a second end position based on the movement of the ejector. An exemplary embodiment can be provided in that the permanent-magnetic component is mechanically coupled to the ejector. To this end, the permanent-magnetic component can even be, for example, an integral part of the ejector. In an exemplary embodiment of the disclosure, the permanent-magnetic component can be a separate permanent magnet, whose translatory movement is coupled to that of the ejector. Another exemplary embodiment of the disclosure can provide that the Hall sensor and the permanent-magnetic component that can be moved in a translatory manner are integral parts of an assembly, which can be mounted on the seat belt lock frame. In another exemplary embodiment of the disclosure, the Hall sensor, the permanent-magnetic component, and the shielding element can be combined in an assembly and designed as a monolithic insert, which includes a common assembly housing and a cover.

The change in the relative distance between the Hall sensor and the permanent-magnetic component can be carried out by a translatory relative movement of the two parts within the assembly housing coupled to the movement of the ejector.

So that the magnetic field produced by the permanent-magnetic component acts as strongly as possible on the Hall sensor, the metal shielding element, in an exemplary embodiment of the disclosure, can be designed geometrically in such a way that a section of the Hall sensor that is arranged in the vicinity of a Hall measuring field lies closer than the other part of the shielding element. For example, to this end, the shielding element can have an end section that is bent in the direction of the Hall sensor. In another exemplary embodiment, the shielding element can be designed as an essentially flat shielding sheet, which can have a cam-like projection projecting relative to the flat extension of the shielding sheet in the vicinity of a Hall measuring field. The cam-like projection can be formed by, for example, an embossing of the shielding sheet. In an exemplary embodiment according to the disclosure, the cam-like projection can be formed by an application of a magnetically conductive material on the shielding sheet, for example, by a soldering point or a spot weld.

So that a good shielding against outer noise fields is ensured, the shielding element can have a width that is measured perpendicular to the moving direction of the ejector and that essentially corresponds to a corresponding width extension of the Hall sensor.

A suitable use of an exemplary seat belt lock that is equipped according to the disclosure includes fastening one's seat belt in the generation of an optical and/or acoustic warning signal for the passenger, for example of an automobile. In addition, the seat belt lock that is equipped according to an exemplary embodiment of the disclosure can also be used for the activation or deactivation of mechanisms for inflating airbags for the passenger of an automobile. A host of other possible uses, an enumeration of which would exceed the scope of this application, are also clear to one skilled in the art.

A seat belt lock depicted in FIG. 1 can have an outer design that is known in the art and is provided overall with the reference number 1. The seat belt lock 1 is used for receiving and detachable locking of a seat belt latch 100, which is connected to a seat belt, not shown. The seat belt lock 1 can have a seat belt lock housing 2, which surrounds a seat belt lock frame 4. The seat belt lock frame 4 includes an upper part 44 and a lower part 45, which bound a guide channel 42 in the joined state. The seat belt lock housing 2 is designed to be open on its front face side 21 and receives an unlocking key 3 there, which is provided with an insert opening 31 for the seat belt latch 100. The insert opening 31 is flush with a feed slot 41 in the seat belt lock frame 4 and allows the feeding of the seat belt latch 100 into the guide channel 42 that is surrounded by the seat belt lock frame 4. The seat belt lock frame 4 extends essentially over the entire length of the seat belt lock housing 2 and is connected to a rear end facing away from the feed slot 41 over a seat belt lock holder, not shown in more detail, that extends through a rear wall 22 of the seat belt lock housing 2, with the frame of a motor vehicle, for example, an automobile.

Within the seat belt lock frame 4, an ejector 5 is arranged, which can be moved in a translatory manner against the return force of a compression spring 51 along the longitudinal extension of the guide channel 42 bounded by the seat belt lock frame 4. A locking body 6 is arranged above the seat belt lock frame 4 and is prestressed by a leaf spring 61 in the direction of the seat belt lock frame 4. A central opening 43 in the upper part 44 of the seat belt lock frame 4 allows the prestressed locking body 6 access to the guide channel 42 surrounded by the seat belt lock frame 4 in the case of locking.

The locking mechanism for the seat belt latch 100 can be designed in a known manner per se. When the seat belt latch 100 is plugged in through the plug-in opening 31 and the feed slot 41 is plugged into the guide channel 42, the ejector 5 is pushed back against the return force of the helical compression spring 51 within the guide channel 42. In this way, it keeps the path free for the locking body 6, prestressed by the leaf spring 61 and arranged above the seat belt lock frame. This locking body is pressed by the leaf spring 61 through the central opening 43 in the upper part 44 of the seat belt lock frame 4 into the channel 42 and extends through a latch recess 101 made in the seat belt latch 100. As a result, the seat belt latch 100 is locked within the seat belt lock 1.

To loosen the locking of the seat belt latch 100, the locking key 3 is pressed. A bevel made on the locking key in this case interacts with a beveled surface provided on the locking body 6 in order to raise the latter from the locking position against the spring force of the leaf spring 61. As soon as the locking body 6 uncovers the guide channel 42, the ejector 5 is moved back again by the returning spring force of the helical compression spring 51 into its starting position, in which it blocks the central opening 43 in an upper part 44 of the seat belt lock frame 4. At the same time, the seat belt latch 100 is ejected back from the ejector 5 in the direction of the feed slot 41 and can be removed from the seat belt lock 1 by the user.

To monitor the state of the seat belt lock 1—unlocked or locked—a Hall sensor is arranged within the seat belt lock housing 2, which bears the reference number 17. To this end, the Hall sensor 17 interacts with a permanent-magnetic component 15 that can be moved in a translatory manner in the actuation of the locking mechanism and is explained in more detail below. The Hall sensor 17 and the permanent-magnetic component 15 can be arranged in an assembly 10 and can have a common assembly housing 11. The assembly housing 11 can be plugged in through, for example, an opening provided in a rear wall 22 of the seat belt lock housing 2, until a rear closing wall 12 connected to the plate-like assembly housing 11 extends flush with the rear wall 22 of the seat belt lock housing 2. As an alternative, the assembly housing 11 can also be fastened to the seat belt lock frame 4. The rear closing wall 12 thus forms an integral part of the rear wall 22 of the seat belt lock housing 2. For production reasons as well as for weight reduction, the switch housing 11 and the rear closing wall 12 can include, for example, plastic.

Figure 2:
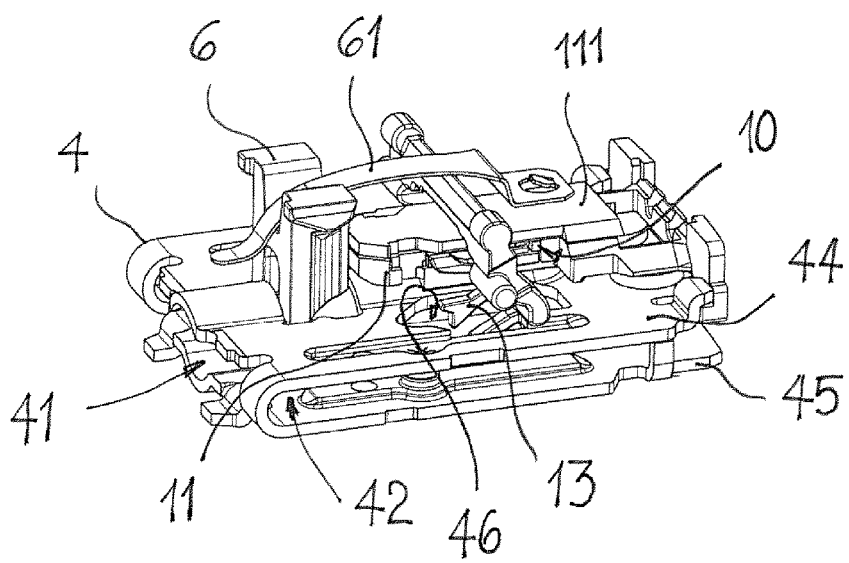
FIG. 2 shows a perspective view from above of a locking mechanism according to an exemplary embodiment of the disclosure in the unlocked state that is arranged in the interior of the seat belt lock, whereby the seat belt lock housing is omitted.

FIG. 2 shows a perspective view from above of the component of the seat belt lock, arranged within the seat belt lock housing, not shown, in the unlocked state. In turn, the seat belt lock frame bears the reference number 4. It can have an upper part 44 and a corresponding lower part 45, both of which parts are essentially designed flat and are connected to one another in such a way that they bound a slit-like guide channel 42 for a plugged-in seat belt latch. The feed slot 41 in the guide channel 42 is indicated on the left-side end of the seat belt lock frame 4. The spring-loaded ejector that can shift in a translatory manner in the guide channel 42 is not visible in the figure. The locking body 6 that is loaded by the leaf spring 61 is located in the unlocked state of the seat belt lock outside of the guide channel 42. The assembly 10 arranged on the upper part 44 of the seat belt lock frame, which includes a Hall sensor and a permanent-magnetic component, is indicated at 10. The assembly 10 is arranged inside an assembly housing 11, which is closed with a cover 111. The cover 11 also serves to fasten the leaf spring 61. Carriers 13 project on the sides of the assembly housing 11, which carriers are connected to a component of the assembly 10, not shown. The carriers 13 extend through openings 46 in the upper part 44 of the seat belt lock frame 4 and project into the movement path of the ejector in the guide channel 42.

Figure 3:
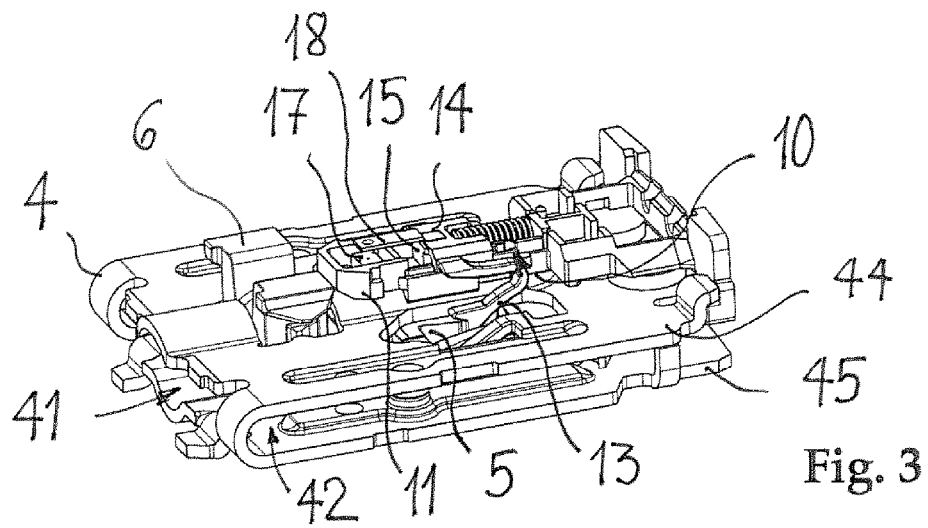
FIG. 3 shows a view of the locking mechanism according to an exemplary embodiment of the disclosure in a locked state, analogous to FIG. 2.

FIG. 3 is a depiction, analogous to FIG. 2, of the components arranged within the seat belt lock housing, not shown. To improve the clarity of the figure, the leaf springs 61 (FIG. 2), the cover 111 (FIG. 2) of the assembly housing 11, and integral parts of the locking mechanism not necessary for understanding the disclosure are omitted. As can be seen from the figure, the locking body 6 is inserted into the guide channel 41 surrounded by the seat belt lock frame 4. Within the guide channel 42, the ejector 5 is pushed away from the feed opening 41 in the direction of the rear end of the seat belt lock frame 4. In this case, it engages in the carrier 13 projecting from the assembly 10 and also moves the latter in a translatory manner. The carriers 13 are fastened to a slide 14 that is arranged within the assembly housing 11 and that is loaded by a helical compression spring 15. The slide 14 is moved in a translatory manner via the carrier 13 within the assembly housing 11 against the return force of the helical compression spring 15. The permanent-magnetic component 15 is fastened to the slide 14, which component interacts magnetically with the Hall sensor 17 arranged in the assembly housing 11. The Hall sensor and the permanent-magnetic component are covered by a metal shielding element 18, which on the one hand performs a shielding function against noise fields from the outside and on the other hand acts as a flow concentrator for the magnetic field that is produced by the permanent-magnetic component 15 and that acts on the Hall sensor 17. The function of these components is explained in more detail below.

Figure 4:
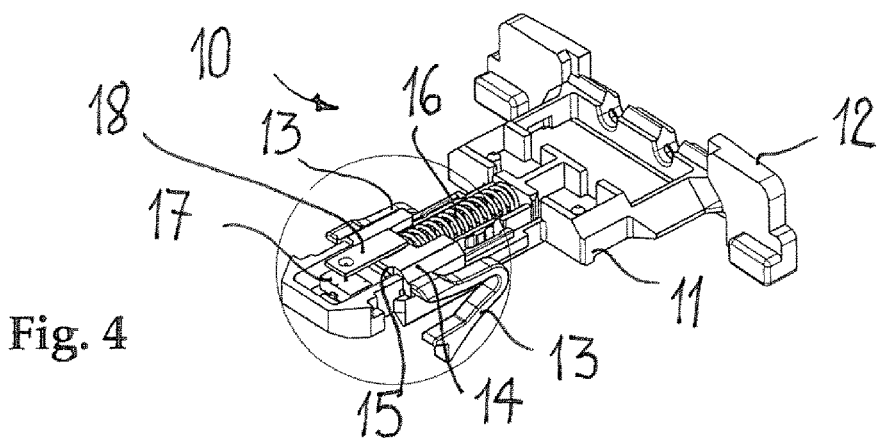
FIG. 4 shows a perspective view of an assembly of a locking mechanism according to an exemplary embodiment of the disclosure containing a Hall sensor and a permanent-magnetic component that can be moved in a translatory manner.

FIG. 4 shows a perspective view of the assembly 10 that includes the Hall sensor 17 and the permanent-magnetic component 15 that can move in a translatory manner. The latter can be mounted, for example, directly on the seat belt lock frame 4. According to the depicted embodiment, the assembly 10 can have a separate assembly housing 11, which, for example, can be plugged in through an opening that is provided in a back wall 22 of the seat belt lock housing 2 until a rear closing wall 12 that is connected to the plate-like assembly housing 11 extends flush with the rear wall 22 (FIG. 1). The rear closing wall 12 then forms an integral part of the rear wall 22 of the seat belt lock housing 2 (FIG. 1). For the sake of production and for weight reduction, the switch housing 11 and the rear closing wall 12 can be to include, for example, plastic. The Hall sensor 17 is arranged in a section of the assembly housing 11 opposite to the rear closing wall 12. The permanent-magnetic component 15 that can move in a translatory manner, for example a permanent magnet, is mounted on a side of the slide 14 facing the Hall sensor 17, which slide is loaded by the helical compression spring 16, which is supported in the assembly housing 11. The slide 14 is connected to two carriers 13, which are arranged in two longitudinal sides of the assembly housing 11 and project over a base plate of the assembly housing 11.

On a side opposite to the base plate of the assembly housing 11, the Hall sensor 17 is covered by a metal shielding element 18. The length of the metal shielding element 18 is proportioned in such a way that it extends approximately from the slide 14, connected to the permanent-magnetic component 15, over the entire Hall sensor 17. The width of the metal shielding element 18 is dimensioned in such a way in this case that it overlaps the width of the Hall sensor 17. The metal shielding element 18 is depicted in FIG. 4 hovering over the Hall sensor and the slide 14. It is understood, however, that the shielding element 18 is mounted securely relative to the assembly housing 11. For example, it is mounted in the interior of a cover 111 (FIG. 3 or FIG. 4) for the assembly housing 11.

In principle, a reversed arrangement of the permanent-magnetic component 15 and the Hall sensor 17 is also possible. That is to say that the permanent-magnetic component can be arranged in a stationary manner in the assembly housing, while the Hall sensor can be connected to the slide and can be moved in a translatory manner together with the latter against the return force of the helical compression spring. In this case, the shielding element can also be mounted on the slide and can be moved together with the latter. In the mounted state, the Hall sensor 17 is shielded, on the one hand, by the metal seat belt lock frame 4 and, on the other hand, by the shielding element 18 against outer scatter fields.

Figure 5:
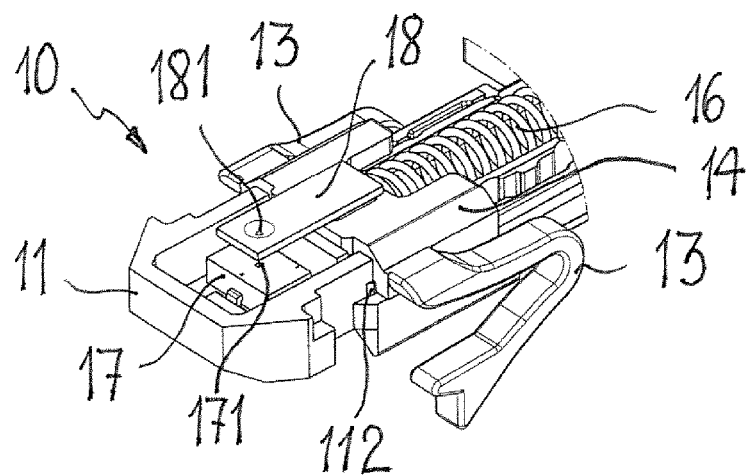
FIG. 5 shows a perspective detail view of the assembly according to FIG. 4.

On an enlarged scale, FIG. 5 shows the section of the assembly 10 that is encircled in FIG. 4. In turn, the assembly housing is provided with the reference number 11. The Hall sensor bears the reference number 17, while the permanent-magnetic component connected to the slide 14 is referred to with 15. The helical compression spring extending between the slide 14 and a wall of the assembly housing 11 is indicated at 16. The slide 14 that is connected to the projecting carriers 13 can be moved in a slip-in guide on the assembly housing 11. A stop 112 on the side of the assembly housing 11 defines a starting position of the slide 14, which corresponds to the unlocked state of the seat belt lock. The metal shield element 18 extends from the slide 14 to cover the Hall sensor 17. An embossing point 181 is indicated on the metal shielding element 18, for example a piece of sheet-metal. On the opposite side of the shielding element 18, which faces the Hall sensor 17, this results in a cam-like projection. The embossing point 181 is arranged, for example, in such a way that it comes to rest just over a Hall measuring field 171. The metal shielding element 18 performs not only the function of shielding against outer noise fields, but rather at the same time it forms a flow concentrator for the magnetic field that is produced by the permanent-magnetic component 15 and that acts on the Hall sensor 17. The distance between the Hall measuring field 171 of the Hall sensor 17 and the shielding element 18 that acts as a flow concentrator is reduced by the embossing point 181, by which it results in an even better concentration or focusing of the magnetic flow on the Hall measuring field 171 of the Hall sensor 17.

From FIG. 2 or FIG. 3, it can be seen that the carriers 13 project through openings 46 in the upper part 44 of the seat belt lock frame 4 into the guide channel 42. In addition, it should also be noted that only a few, essentially centrally arranged carriers could also project from the slide. In the case of an individual carrier, the latter projects through a single corresponding opening provided in the upper part of the seat belt lock frame in the movement path of the ejector. In the translatory movement of the ejector 5, the latter abuts the free ends of the carrier 13 and entrains the latter. As a result, the slide 14 that is arranged in the assembly housing 11 also moves in a translatory manner against the return force of the helical compression spring 16. The permanent-magnetic component 15 that is connected to the slide necessarily takes part in the displacement movement. As a result, the distance between the Hall sensor 17 and the permanent-magnetic component 15 changes. The thus created change of the magnetic field strength that acts on the Hall sensor 17 results in a signal change at the output of the Hall sensor 17, from which signal change the locking state of the seat belt lock can be determined.

Figure 6:
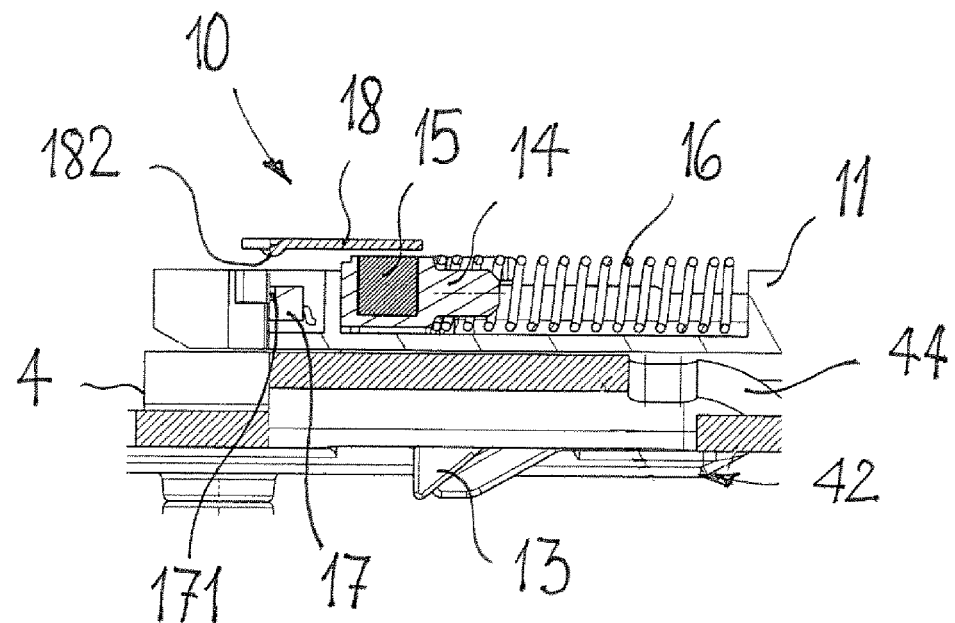
FIG. 6 shows a sectional view of the assembly, mounted on a seat belt lock frame, according to FIG. 4 in an unlocked state of the locking mechanism.
Figure 7:
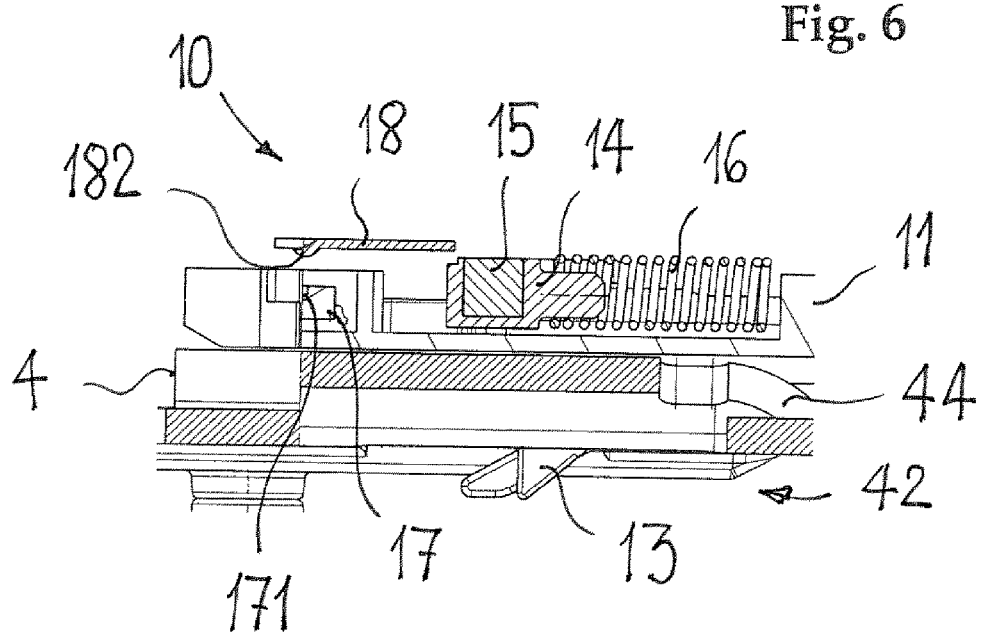
FIG. 7 shows a sectional view of the assembly, mounted on the seat belt lock frame, according to FIG. 4 in the locked state of the locking mechanism.

In sectional views, FIG. 6 and FIG. 7 show the assembly 10 mounted on the seat belt lock frame 4 in the unlocked state (FIG. 6) and in the locked state (FIG. 7) of the seat belt lock. The assembly housing bears the reference number 11. In the unlocked state (FIG. 6), the slide 14 that is loaded by the helical compression spring 16 is located with the permanent-magnetic component 15 in its starting position. In this case, the permanent-magnetic component 15 and the Hall sensor 17 have a preset first interval optimized to the signal strength. The shielding element 18 extends from the permanent-magnetic component 15 to over the Hall sensor 17. It is understood that the shielding element is not—as depicted—arranged in a "hovering" manner. For example, the shielding element 18 is mounted on a cover of the assembly housing 11.

In FIG. 6, a cam-like projection 182 is also indicated on the shielding element, which projection is produced by, for example, an embossing of the shielding element on the side (FIG. 5) facing away from the Hall sensor 17. The cam-like projection 182 on the shielding element 18 is suitably located above the Hall measuring field 171 of the Hall sensor 17. By the geometric design of the shielding element 18, an optimal concentration of the magnetic field, produced by the permanent-magnetic component 15, on the Hall measuring field 171 of the Hall sensor 17 can be achieved in the starting position.

The majority of the magnetic field can be directed over the flow concentrator 18 to the Hall measuring field 171 and goes from there over the upper part 44 of the seat belt lock frame 4 back to the permanent-magnetic component 15. The shielding element 18 thus performs not only the function of a shielding against outer noise fields but at the same time can also act as a flow concentrator. The cam-like projection 182 can also be formed by an application of a magnetically-conductive material on the shielding sheet 18, for example by a soldering point or a spot weld. Instead of a cam-like projection, the shielding element can also have an end section that is bent in the direction of the Hall measuring field. The Hall sensor 17 is shielded by the shielding element 18 and by the seat belt lock frame 4, for example, by the upper part 44 of the seat belt lock frame 4, virtually completely against outer noise fields. With respect to FIG. 6, it can also be mentioned that a carrier that projects into the guide channel 42 of the seat belt lock frame 4 is indicated at 13.

In a sectional view analogous to FIG. 6, FIG. 7 shows conditions of the assembly 10 mounted on the seat belt lock frame 4 in the locking state of the seat belt lock. It can be seen that the carrier 13 projecting into the guide channel 42 was moved by the translatory movement of the ejector that is not depicted in more detail. Correspondingly, the slide 14 that is connected to the carrier 13 is moved together with the permanent-magnetic component 15 mounted thereon against the return force of the helical compression spring 16 in the assembly housing 11. As a result, the distance between the permanent-magnetic component 15 and the Hall sensor 17 is increased. The majority of the magnetic field produced by the permanent-magnetic component 15 now no longer flows through the Hall measuring field 171, but rather already prior to that, flows over the upper part 44 of the seat belt lock frame 4 back to the permanent-magnetic component 15. The difference in the magnetic field strength is detected by the Hall sensor 17. The resulting signal change at the output of the Hall sensor 17 is an indicator of the locking state of the seat belt lock.

The disclosure has been described in an exemplary embodiment of an assembly, which is mounted in or on a plate-like assembly housing, whose cover carries the shielding element. The assembly can be designed as a monolithic insert that can be very advantageous for example for the mounting. It is understood, however, that there can also be deviations from these exemplary embodiments that are described as examples. For example, the components of the assembly can be mounted separately on the seat belt lock frame and/or in the seat belt lock housing.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A seat belt lock comprising:
    a Hall sensor for detection of a locking state of the seat belt lock;
    a metal seat belt lock frame arranged in a seat belt lock housing, the frame having an essentially flat upper part and a corresponding essentially flat lower part, the upper part and the lower part being connected to one another in such a way that they bound a slit-like guide channel to receive an inserted seat belt latch;
    a spring-loaded locking body for locking a seat belt latch when inserted, the spring-loaded locking body being mounted on the seat belt lock frame; and
    a spring-loaded ejector for an inserted seat belt latch, the spring-loaded ejector being moveable in the guide channel in a translatory manner between a first end position and a second end position, the seat belt latch being coupled to a locking mechanism, as well as to the Hall sensor for detection of a locking state of the seat belt lock, wherein the Hall sensor will interact with a permanent-magnetic component, whose distance relative to the Hall sensor will change based on the translatory movement of the ejector during actuation of the locking mechanism, the Hall sensor being arranged on or in the seat belt lock frame and being covered by a metal shielding element extending essentially parallel to the seat belt lock frame and forming a flow concentrator for a magnetic field produced by the permanent-magnetic component and acting on the Hall sensor.

2. The seat belt lock according to claim 1, wherein the Hall sensor and the shielding element are arranged in a stationary manner on the seat belt lock frame.

3. The seat belt lock according to claim 1, wherein the permanent-magnetic component is moveable based on movement of the ejector in a translatory manner from the first end position into the second end position.

4. The seat belt lock according to claim 3, wherein the permanent-magnetic component is a separate permanent magnet, which is mechanically coupled to the ejector.

5. The seat belt lock according to claim 3, wherein the Hall sensor and the permanent-magnetic component that are moveable in a translatory manner are integral parts of an assembly, which can be mounted on the seat belt lock frame.

6. The seat belt lock according to claim 1, comprising:
    an assembly housing, closeable with a cover;
    wherein the Hall sensor, the permanent-magnetic component and the shielding element are combined in an assembly and designed as a monolithic insert and mounted in or on the assembly housing.

7. The seat belt lock according to claim 1, wherein a change in relative distance between the Hall sensor and the permanent-magnetic component will be related to movement of the ejector.

8. The seat belt lock according to claim 1, wherein the metal shielding element is shaped such that a section that is arranged in a vicinity of a Hall measuring field is closer to the Hall sensor than any other part of the shielding element.

9. The seat belt lock according to claim 8, wherein the shielding element comprises:
    an end section bent in a direction of the Hall sensor.

10. The seat belt lock according to claim 8, wherein the shielding element is configured as an essentially flat shielding sheet and comprises:
    a projection projecting relative to a flat surface of the shielding sheet in a vicinity of a Hall measuring field.

11. The seat belt lock according to claim 10, wherein the projection is an embossing of the shielding sheet.

12. The seat belt lock according to claim 10, wherein the projection is an application of a magnetically-conductive material on the shielding sheet.

13. The seat belt lock according to claim 1, wherein the shielding element has a width measured perpendicular to a movable direction of the permanent-magnetic component, which essentially corresponds to a corresponding width extension of the Hall sensor.

14. The seal belt lock according to claim 1, in combination with:
- a seal belt latch configured for insertion into the seat belt lock and for engagement by the spring-loaded locking body.

15. The seat belt lock according to claim 10, wherein the projection is a point of magnetically conducive material that is soldered or spot welded to a lower surface of the shielding sheet.

* * * * *